US010720994B2

(12) United States Patent
Cevrero et al.

(10) Patent No.: US 10,720,994 B2
(45) Date of Patent: *Jul. 21, 2020

(54) PAM-4 TRANSMITTER PRECODER FOR 1+0.5D PR CHANNELS

(71) Applicant: International Business Machines Corporation, Armonk, NY (US)

(72) Inventors: Alessandro Cevrero, Oberrieden (CH); Pier Andrea Francese, Adliswil (CH); Marcel A. Kossel, Reichenburg (CH); Christian I. Menolfi, Langnau am Albis (CH); Ilter Özkaya, Adliswil (CH); Thomas H. Toifl, Gattikon (CH)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/272,497

(22) Filed: Feb. 11, 2019

(65) Prior Publication Data
US 2019/0173586 A1  Jun. 6, 2019

Related U.S. Application Data

(63) Continuation of application No. 15/827,960, filed on Nov. 30, 2017, now Pat. No. 10,205,525.

(51) Int. Cl.
| | |
|---|---|
| *H04B 10/04* | (2006.01) |
| *H04B 10/50* | (2013.01) |
| *H04B 10/524* | (2013.01) |
| *H03F 1/06* | (2006.01) |
| *H04L 25/49* | (2006.01) |
| *H04L 25/497* | (2006.01) |

(52) U.S. Cl.
CPC .......... *H04B 10/5055* (2013.01); *H03F 1/06* (2013.01); *H04B 10/50593* (2013.01);
(Continued)

(58) Field of Classification Search
CPC .......... H04B 10/2507; H04B 10/25753; H04B 10/40; H04B 10/516; H04B 10/5055;
(Continued)

(56) References Cited

U.S. PATENT DOCUMENTS

| 7,529,323 B2 | 5/2009 | Lui et al. |
| 8,681,849 B2 | 3/2014 | Taubin et al. |

(Continued)

OTHER PUBLICATIONS

Min et al., "A 20Gb/s Triple-Mode (PAM-2, PAM-4, and Duobinary) Transmitter," 2011 IEEE 54th International Midwest Symposium on Circuits and Systems (MWSCAS), 2011, pp. 1-4.
(Continued)

*Primary Examiner* — Hanh Phan
(74) *Attorney, Agent, or Firm* — Nathan M. Rau

(57) ABSTRACT

A system and method for a high-speed transmitter comprising a precoder configured to receive a sequence of input symbols and to generate for each received symbol a respective recoded symbol is disclosed. The transmitter includes a recoding unit configured for recoding each current received PAM-M based on the recoded symbol immediately preceding the current recoded symbol at the recoding unit, a shift unit configured for determining a shift value for each current received symbol from the recoding unit based on the symbol received from the recoding unit and immediately preceding the current symbol at the shift unit; and Feed-Forward Equalizer unit for applying the shift values to the respective symbols received from the recoding unit to generate a corresponding sequence of output symbols to be transmitted in an output stream.

7 Claims, 8 Drawing Sheets

(52) U.S. Cl.
CPC ..... *H04B 10/50597* (2013.01); *H04B 10/524* (2013.01); *H04L 25/4921* (2013.01); *H04L 25/4975* (2013.01)

(58) Field of Classification Search
CPC ................ H04B 10/5059; H04B 10/58; H04L 25/03343; H04L 25/4975
USPC ......... 398/192, 193, 194, 81, 183, 188, 189, 398/158, 159, 135, 136; 375/232, 233, 375/376, 229, 296, 259, 295, 230
See application file for complete search history.

(56) References Cited

U.S. PATENT DOCUMENTS

| | | | |
|---|---|---|---|
| 9,020,021 B2* | 4/2015 | Kossel | H04L 25/03343 375/229 |
| 9,031,178 B2* | 5/2015 | Bliss | H04B 10/25 375/296 |
| 10,205,525 B1 | 2/2019 | Cevrero et al. | |
| 2007/0014345 A1 | 1/2007 | Gu et al. | |

OTHER PUBLICATIONS

Shibasaki et al., "A 56-Gb/s Receiver Front-End with a CTLE and 1-Tap DFE in 20-nm CMOS," 2014 Symposium on VLSI Circuits Digest of Technical Papers, Jun. 2014, pp. 1-2.

"Forum 6: I/O Design at 25Gb/s and Beyond: Enabling the Future Communication Infrastructure for Big Data," 2015 IEEE International Solid-State Circuits Conference, Feb. 2015, p. 52.

List of IBM Patents or Patent Applications Treated as Related, Signed Feb. 11, 2019, 2 pages.

* cited by examiner

| k | $x_n$ | $x_{n+1}$ | $w^k_{n+NPRE}$ |
|---|---|---|---|
| 0 | -3 | -3 | $-3*h_{2n}-3*h_{2n-1}+dw_{2n}+dw_{2n-1}$ |
| 1 | -3 | -1 | $-3*h_{2n}-1*h_{2n-1}+dw_{2n}-dw_{2n-1}$ |
| 2 | -3 | +1 | $-3*h_{2n}+1*h_{2n-1}+dw_{2n}+dw_{2n-1}$ |
| 3 | -3 | +3 | $-3*h_{2n}+3*h_{2n-1}+dw_{2n}-dw_{2n-1}$ |
| 4 | -1 | -3 | $-1*h_{2n}-3*h_{2n-1}-dw_{2n}+dw_{2n-1}$ |
| 5 | -1 | -1 | $-1*h_{2n}-1*h_{2n-1}-dw_{2n}+dw_{2n-1}$ |
| 6 | -1 | +1 | $-1*h_{2n}+1*h_{2n-1}-dw_{2n}+dw_{2n-1}$ |
| 7 | -1 | +3 | $-1*h_{2n}+3*h_{2n-1}+dw_{2n}+dw_{2n-1}$ |
| 8 | +1 | -3 | $+1*h_{2n}-3*h_{2n-1}+dw_{2n}+dw_{2n-1}$ |
| 9 | +1 | -1 | $+1*h_{2n}-1*h_{2n-1}+dw_{2n}-dw_{2n-1}$ |
| 10 | +1 | +1 | $+1*h_{2n}+1*h_{2n-1}+dw_{2n}+dw_{2n-1}$ |
| 11 | +1 | +3 | $+1*h_{2n}+3*h_{2n-1}+dw_{2n}-dw_{2n-1}$ |
| 12 | +3 | -3 | $+3*h_{2n}-3*h_{2n-1}-dw_{2n}-dw_{2n-1}$ |
| 13 | +3 | -1 | $+3*h_{2n}-1*h_{2n-1}-dw_{2n}-dw_{2n-1}$ |
| 14 | +3 | +1 | $+3*h_{2n}+1*h_{2n-1}-dw_{2n}+dw_{2n-1}$ |
| 15 | +3 | +3 | $+3*h_{2n}+3*h_{2n-1}-dw_{2n}-dw_{2n-1}$ |

FIG. 3B

PAM-4 TRANSMITTER PRECODER FOR 1+0.5D PR CHANNELS

BACKGROUND

The present disclosure relates to the field of digital computer systems, and more specifically, to a PAM-4 transmitter precoder for 1+0.5D PR channels.

High-speed links are buses that are operated either between computer components such as between a processor and a memory buffer chip or between network interface cards. Precoders, such as a Tomlinson Harashima Precoder can be used to cancel the Intersymbol Interference of the Channel. Tomlinson Harashima precoders are usually used as part of the transmitters of such components. Those precoders however require improvements in particular at high rates.

SUMMARY

Various embodiments provide a transmitter and a method for generating a sequence of output symbols to be transmitted in an output stream as described by the subject matter of the independent claims. Advantageous embodiments are described in the dependent claims. Embodiments of the present disclosure can be freely combined with each other if they are not mutually exclusive.

In one aspect, the disclosure relates to a high-speed transmitter comprising a transmitter precoder which is adapted to receive a sequence of input symbols and to generate for each received symbol a respective recoded symbol. The sequence of input symbols is part of a data stream which is modulated using a pulse amplitude modulation (PAM) scheme having an order M. The transmitter further includes a recoding unit of the transmitter precoder is configured for recoding each current received symbol based on the recoded symbol immediately preceding the current recoded symbol at the recoding unit. Additionally, a shift unit is configured for determining a shift value for each current received symbol from the recoding unit based on the symbol received from the recoding unit and immediately preceding the current symbol at the shift unit. Finally, the transmitter has a feed-forward equalizer (FFE) unit for applying the shift values to the respective symbols received from the recoding unit so as to generate a corresponding sequence of output symbols to be transmitted in an output stream.

In another aspect, the disclosure relates to a method for generating a sequence of output symbols to be transmitted in an output stream. The method begins by receiving a sequence of PAM-M coded symbols Xn. Next the received symbols are recoded wherein recoding a current received symbol Xn is performed based on an immediately preceding recoded symbol Yn−1 resulting in output recoded symbols Yn of the respective received symbols Xn. For each output recoded symbol Yn the method determines a shift value for the symbol Yn using an output recoded symbol Yn−1 immediately preceding the symbol Yn. Next a FFE transfer function value is determined for the symbol Yn and a IIR transfer function value is determined for the shift value of the symbol Yn. Then the determined FFE transfer function value is applied to the symbol Yn, and the convolution of the determined FFE transfer function with a truncated IIR transfer function to the shift value of the symbol Yn, for generating an output symbol.

BRIEF DESCRIPTION OF THE DRAWINGS

In the following embodiments of the disclosure are explained in greater detail, by way of example only, making reference to the drawings in which:

FIG. 3B is a table comprising coefficient values for PAM-4 symbols.

DETAILED DESCRIPTION

Figure 1:
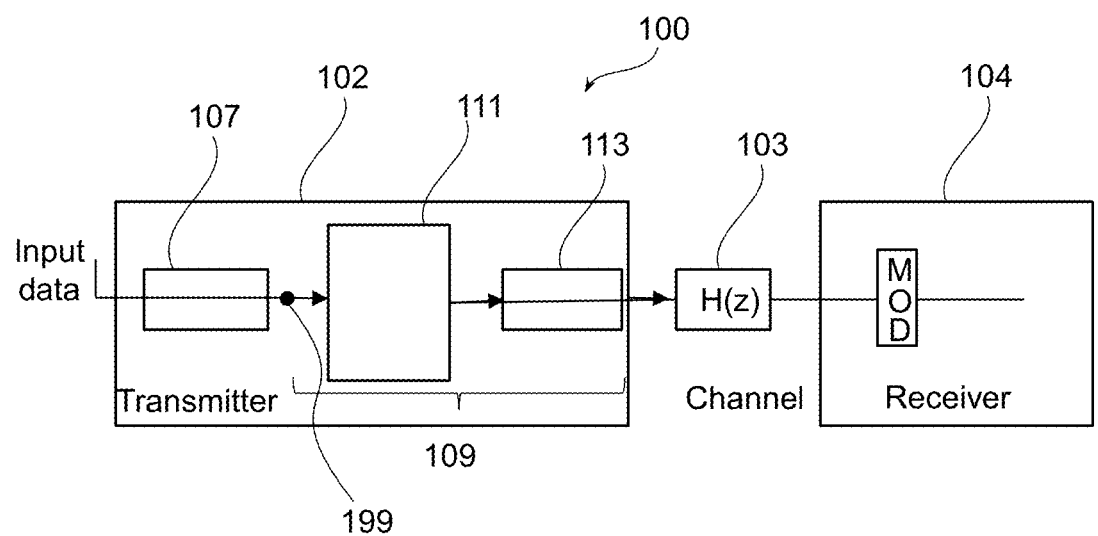
FIG. 1 illustrates a communication system for high-speed data communications.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The transmitter precoder may be a precoder for a partial-response (PR) channel having an impulse response of 1+0.5D. For example, a PAM-4 symbol may be associated with four possible levels e.g. −3 volts, −1 volt, 1 volt, and 3 volts. The application of the shift values at the precoder causes that at the receiver side, each set of M distinct symbols may be associated with at least M+1 amplitude levels. For example, for M=4 five possible levels e.g. −3 volts, −1 volt, 1 volt, and 3 volts and −3 volts (duplicated) may be part of the constellation at the receiver side.

The precoder may for example receive a sequence of PAM-4 symbols X0-Xn. For the very first symbol of the sequence e.g. X0 (i.e. the symbol of the PAM-M stream that is first received), a predetermined initial arbitrary value (e.g. one of the PAM-4 amplitude values −3, 3, −1 and +1) may be used so as to recode X0 accordingly and to output Y0 which is the recoded symbol of X0. In another example, the very first symbol X0 may be considered as the recoded symbol Y0.

The present disclosure may have the advantage that no PAM-4 decision feedback equalization (DFE) may be needed at the receiver of communication system including the present transmitter. For example, only one slicer level more may be needed.

In addition, the input range of the receiver may be smaller than in DFE case (+/−4 instead +/−4.5 for 1+0.5D channel). This may enable relaxed requirements on linearity for input data path at the receiver.

Another advantage may be that no error may be propagated using the present transmitter. This may simplify error correction. The present disclosure may enable set partitioning by for example applying forward error correction (FEC)

on LSB values of the symbols only which may reduce coding overhead by 50% E.g.: RS(255,239), overhead=6% to 3%.

Another advantage may be that the present disclosure provides a simple precoding implementation without the need of closing the timing in a feedback loop involving arithmetic operations as is the case for example, in. implementations of Tomlinson-Harashima precoders. The only feedback loop is the recursive symbol mapping in the recoding unit (265 described below), which may be implemented at high speed.

According to one embodiment, the shift unit and recoding unit are part of the transmitter precoder, wherein the adding unit comprises a transmit digital filter which is adapted for a given symbol to separately apply a transmit filter response to each bit of the symbol and to the shift value of the symbol before adding them, wherein the transmit filter response comprises a FFE filter response for the bits, wherein the transmit filter response comprises a FFE response filter in combination with a IIR filter response for the shift value. The IIR filter response may optionally be truncated which leads to negligible error values if the length of the FFE is chosen appropriately.

According to one embodiment, the shift unit is part of the adding unit wherein the adding unit comprises a table based digital filter comprising a look-up table associating each symbol type to a respective transmit filter response, wherein the transmit filter response for a given symbol comprises the shift value of the symbol in combination with the IIR response filter FFE filter response for the bits of the given symbol.

According to one embodiment, the IIR filter has a filter feedback response G(z) given by the following equation 1/(1+0.5z−1).

According to one embodiment, the transmit digital filter comprises 4 to 16 taps.

According to one embodiment, the order M greater than two. According to one embodiment, the order M is 4, 6 or 8.

According to one embodiment, in case the order M is 4 the shift value is equal to 0.5 or −0.5.

According to one embodiment, the transmitter is a transmitter for electrical interconnects.

FIG. 1 illustrates a communication system 100 for high-speed data communications, in accordance with an example of the present disclosure. The communication system 100 includes a transmitter 102, channel 103 and receiver 104. The transmitter 102 is configured to send data to the receiver 104 via channel 103. The communication system 100 involves a precoding technique where the filtering operation is performed at the transmitter 102 and the receiver 104 may thus comprise a simplified structure e.g. comprising a modulo operation.

The transmitter 102 comprises a data encoder 107 and a precoding and filtering section 109. The encoder 107 receives a stream of digital input data samples from a data source, and generates a corresponding sequence of PAM symbols. The encoder 107 may be configured to perform pulse-amplitude modulation (PAM) where the message information is encoded in the amplitude of a series of signal pulses. For example, a two bit modulator (PAM-4) takes two bits at a time and maps the signal amplitude to one of four possible levels e.g. −3 volts, −1 volt, 1 volt, and 3 volts. As an example, the sequence of PAM symbols may be a PAM-4 sequence (e.g. having 4 symbols) and hence can be represented using a sequence of two binary bits. The symbols generated by the encoder 107 are input to a precoder 111 of the section 109, which recodes the symbols. The recoded symbols are input to a transmit filter 113 in order to be filtered. The transmit filter 113 is configured to operate in cooperation with precoder 111. In one example, the transmit filter 113 may be part of the precoder 111. The channel 103 is a partial-response (PR) channel having an impulse response of 1+0.5D. The channel 103 may for example be provided with Z-domain response {H(z)}. For example for received PAM-4 coded symbols, the precoding and filtering section 109 is configured to output recoded symbols such that at the receiver 104 5 amplitude levels are in the constellation as shown in eye diagram of FIG. 5. For example, compared to the original data patterns, the eye diagram of FIG. 5 contains one additional amplitude level. The original patterns for an M-ary (e.g. M=4) system, where an information source emits a sequence of symbols that consists of M symbols. Each amplitude level at the original pattern corresponds to a distinct symbol, so that there are M distinct amplitude levels to be transmitted. In addition with the present method at the precoding and filtering section 109 an additional amplitude level is provided at the receiver 104.

Figure 2A:
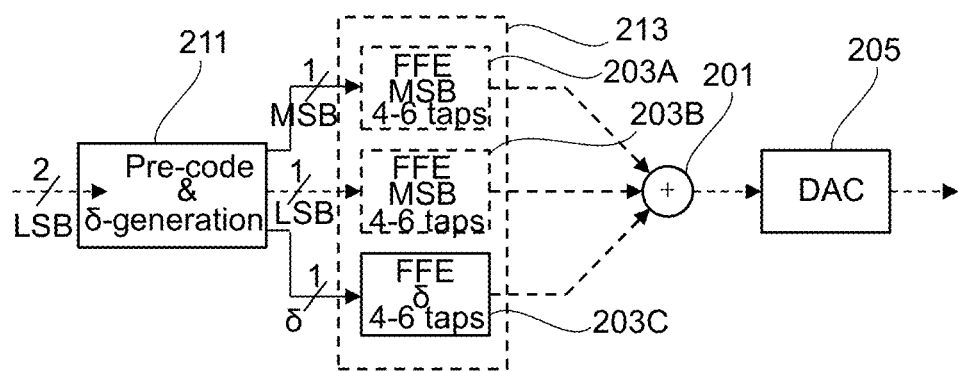
FIG. 2A illustrates details of the precoding and filtering section of the communication system.

FIG. 2A illustrates details of the precoding and filtering section 109 in accordance with an example of the present disclosure.

The precoder 211 is configured to generate PAM-4 recoded symbols and their respective shift values δ. FIG. 2C describes in details a method for generating PAM-4 recoded symbols and their respective shift values δ. A symbol which is output by the precoder 211 comprises two bits namely a least significant bit (LSB) and most significant bit (MSB).

For example, each symbol output by the precoder 211 is associated with a triplet {LSB, MSB, δ}. As illustrated in FIG. 2A, each element of the triplet is filtered separately before being summed up at the adder 201. FIG. 2A shows that the MSB of a given symbol is filtered by the FFE filter 203A. The LSB of the given symbol is filtered by the FFE filter 203B. The shift value δ of the given symbol is filtered by the FFE filter 203C. The summed signal output of the adder 201 is input to a digital to analogue signal converter DAC 205. FFE filters 203A-C may be implemented as digital look-up tables (e.g. with an estimated total power <1 pJ/bit).

Figure 2B:
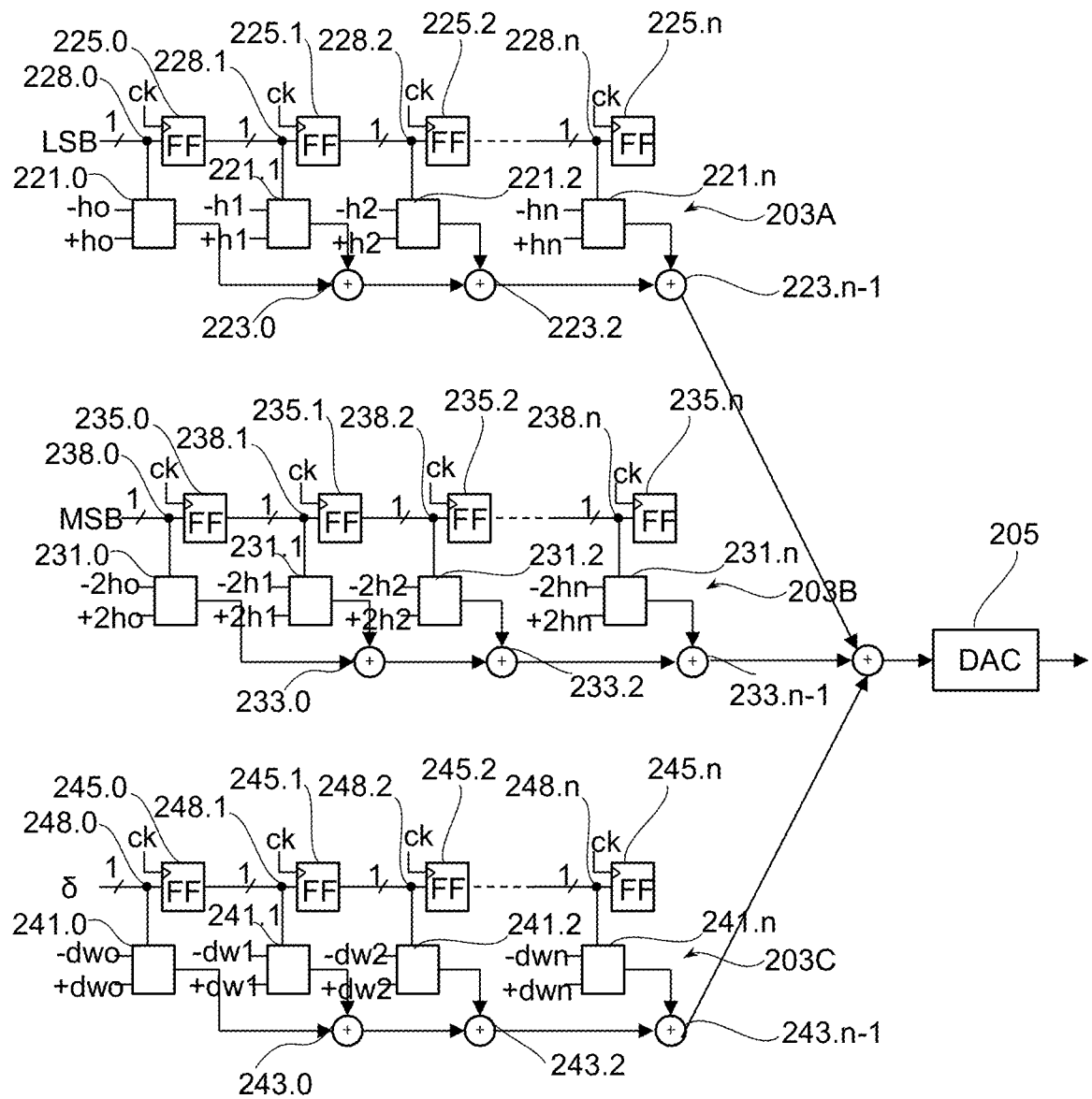
FIG. 2B illustrates details of the filters of FIG. 2A.
Figure 2C:
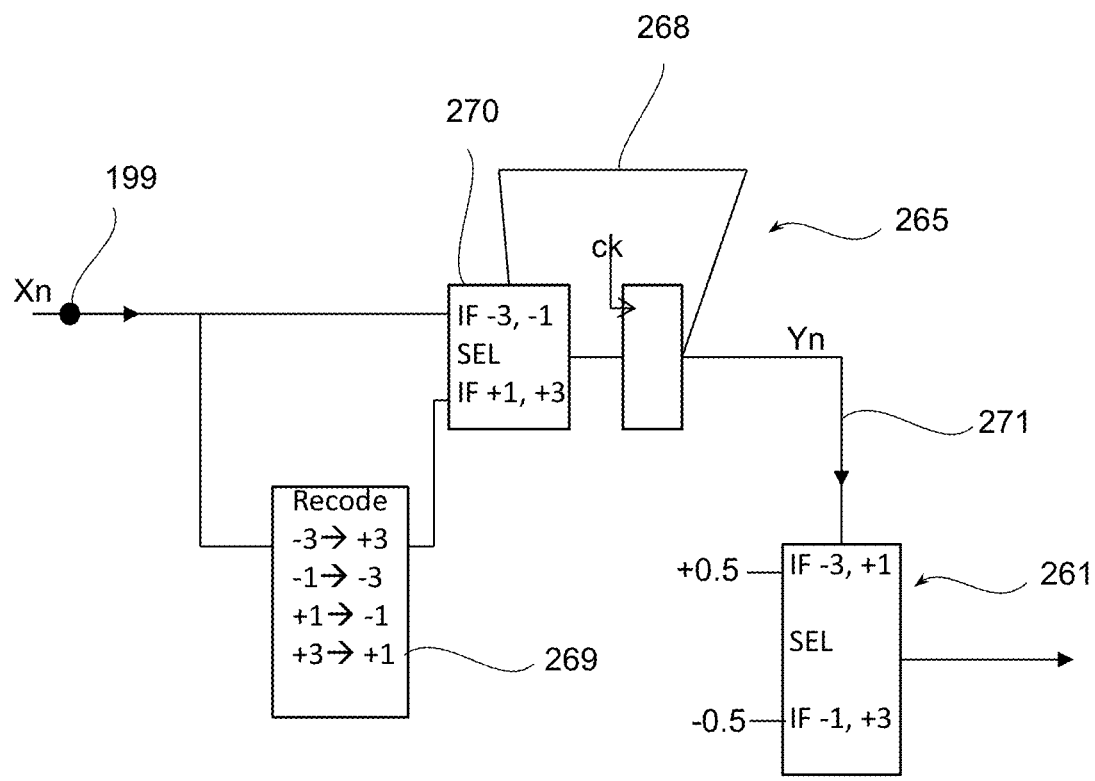
FIG. 2C illustrates details of the precoder of FIG. 2A.

FIG. 2B illustrates details of the filters 203A-C of FIG. 2A. Each of the filters 203A-C comprises n+1 taps, where n has for example a value between 3 and 5.

Each tap of the filter 203A comprises a flip flop 225.0-225.$n$, a multiplier 221.0-221.$n$ and a summer 223.1-223.$n$ (except for the first tap). The multiplier 221.0-$n$ comprises a 2:1 MUX cell (also referred to as multiplexer) that is configured to select a transfer function value out of two FFE transfer function values −hn or +hn based on the value of the LSB being processed at point 228.$n$. For example, at point 228.0, the value of LSB is input to MUX cell 221.0 such that the MUX cell selects one of the transfer function values −h0 and +h0 that is applied to the LSB. The outputs of the MUX cells 221.0-$n$ are added by adders or summers 223.0-223.$n$−1 (e.g. n−1 adders for the n MUX cells outputs).

Flip flop 225.0-$n$ delays an output from a previous tap, and multiplier 221.0-$n$ multiples the output from flip flop 225.0-$n$ by a coefficient W. The output of multiplier 221.0-$n$ is added to an output from of previous tap by summer 223.1-$n$. The selection of the coefficients W is performed using the MUX cell that is configured to select among two values based on the input value to the MUX.

Each tap of the filter 203B comprises a flip flop 235.0-235.$n$, a multiplier 231.0-231.$n$ and a summer 233.1-233.$n$ (except for the first tap). The multiplier 231.0-$n$ comprise a 2:1 MUX cell that is configured to select a transfer function value out of two transfer function values −2hn or +2hn based on the value of the MSB being processed at point 238.*n*. For example, at point 238.0, the value of MSB is input to MUX cell 231.0 such that the MUX cell selects one of the transfer function values −2*h*0 and +2*h*0 that is applied to the MSB. The outputs of the MUX cells 231.0-*n* are added by adders 233.0-233.*n*−1 (e.g. n−1 adders for the n MUX cells outputs). For example, the value 2*hn is chosen for MSB such that the combinations of 2*hn and hn for the LSB may result in one of the amplitude values −3. +3, −1 and +1.

Flip flop 235.0-*n* delays an output from a previous tap, and multiplier 231.0-*n* multiples the output from flip flop 235.0-*n* by a coefficient W. The output of multiplier 231.0-*n* is added to an output from of previous tap by summer 233.1-*n*. The selection of the coefficients W is performed using the MUX cell that is configured to select among two values based on the input value to the MUX.

Each tap of the filter 203C comprises a flip flop 245.0-245.*n*, a multiplier 241.0-241.*n* and a summer 243.1-243.*n* (except for the first tap). The multiplier 241.0-*n* comprise a 2:1 MUX cell that is configured to select a coefficient out of two coefficients −dwn or +dwn based on the value of the shift δ being processed at point 248.*n*. The coefficient dwn comprises a FFE transfer function value convoluted with a IIR transfer function value, wherein the transfer function of the IIR filter is $1/(1+0.5z^{-1})$. For example, at point 248.0, the value of δ is input to MUX cell 241.0 such that the MUX cell 241.0 selects one of the coefficients −dw0 and +dw0 that is applied to the shift δ. The outputs of the MUX cells 241.0-*n* are added by adders 243.0-243.*n*−1 (e.g. n−1 adders for the n MUX cells outputs).

Flip flop 245.0-*n* delays an output from a previous tap, and multiplier 241.0-*n* multiples the output from flip flop 245.0-*n* by a coefficient W (−dwn, +dwn). The output of multiplier 241.0-*n* is added to an output from of previous tap by summer 243.1-*n*. The selection of the coefficients W is performed using the MUX cell that is configured to select among two values based on the input value to the MUX.

FIG. 2C illustrates details of the precoder 211 of FIG. 2A.

The precoder 211 comprises a recoding unit 265 and a shift unit 261. The recoding unit 265 comprises a selection block 270 and a register 268. The register 268 may for example be initialized at an initial arbitrary value (e.g. one of the amplitude values −1, −3, +3 or +1) that can be used for the very first symbol that is input to the precoder 211 and that is to be processed in order to provide it as a recoded symbol. The initial value is chosen such that the output converges independent of the initial value. The recoding and shift units 261 and 265 may for example be connected e.g. in series at point 199 of the transmitter 102 such that the recoding unit 265 can receive as input the PAM-4 symbols.

The recoding unit 265 is configured to change a PAM-4 symbol based on a symbol immediately preceding a current symbol. For simplification purpose the symbols outputs from the recoding unit 265 are referred to as "recoded symbols" Y1-Yn. However, an output symbol of the recoding unit 265 may or may not be recoded. For example, assuming that the current symbol is Xn which is input at point 199. The output of register 268 corresponds to the previous recoded symbol Yn−1, which is used as selector signal in the selection block 270. As indicated in FIG. 2C, if a previous recoded symbol Yn−1={−3, −1} (i.e. Yn−1=−3 or −1), the recoding unit 265 does nothing in that the current symbol Xn is output as it is received. If the previous recoded symbol Yn−1={+1, +3}, the recoding unit 265 changes the values of the current symbol Xn such that it represents another level. For example, the recoding unit 265 comprises a table 269 that maps the value of a symbol to the value into which that symbol is to be recoded. For example, if the current symbol reflects the level −3, −1, +1 or +3 it is recoded using selection block 270 to reflect respectively the levels +3, −3, −1, +1. In this example, the shift unit 265 is connected to the recoding unit such that the output 271 of the recoding unit 265 is input to the shift unit. Thus the symbols outputs by the recoding unit 265 are received in a stream at the shift unit 261. A symbol output by the recoding unit 265 may or may not be recoded as indicated above.

The shift unit 261 has two input values −0.5 and +0.5 which are the values of the shift δ. The shift unit 261 is configured to select for a current symbol received from the recoding unit 265 e.g. Yn one of the shift values −0.5 and +0.5 based on the symbol Yn−1 immediately preceding the symbol Yn, wherein the shift unit 261 receives symbol Yn−1 immediately after receiving symbol Yn from the recoding unit 265. For example, if there is a sequence of symbols Yn output from the recoding unit 265 and if the current symbol is Yn, the shift unit 261 may be configured to use the symbol Yn−1 to select one of the values −0.5 and 0.5 based on the value of or the level associated with the recoded symbol Yn−1. For example, for current Yn, δ=+0.5 if its preceding symbol Yn−1={−3,+1}, and δ=−0.5 if its preceding symbol Yn−1={−1,+3}.

Figure 3A:
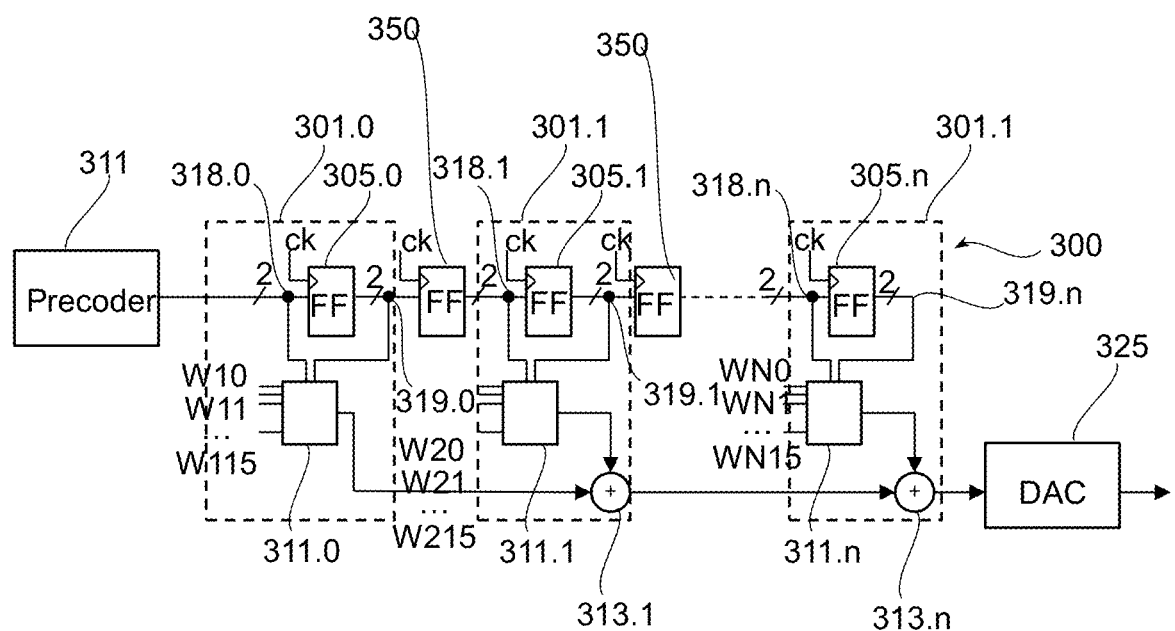
FIG. 3A illustrates details of the precoding and filtering section in accordance with another example of the present disclosure.

FIG. 3A illustrates details of the precoding and filtering section 109 in accordance with another example of the present disclosure.

The precoder 311, in this example, comprises the recoding unit 265 as described above. The precoder 311 has the structure of precoder of FIG. 2C except that the shift unit is not part of the precoder 311. In this example, the shift values δ are determined at the transmit filter 300. The output of the precoder 311 is the PAM-4 recoded symbols that have been processed and output by the recoding unit. These PAM-4 recoded symbols are input to the transmit filter 300.

The transmit filter 300 comprises multiples taps 301.0-301.M. the transmit filter 300 may for example be a table-based FFE where for each PAM-4 symbol a value from look-up table (e.g. 16-entries per 2 PAM-4 symbols) may be selected. The table entries are constructed such that they incorporate shift δ values. The present system may be advantageous as no additional power may be need except for pre-coding, which may be negligible.

Each tap of the filter 300 comprises a flip flop 305.0-305.*n*, a multiplier 311.0-311.*n* and a summer 313.1-313.*n* (except for the first tap). The multiplier 311.0-*n* comprises a 16:1 MUX cell that is configured to select a coefficient W out of 16 coefficients based on the value of the pair of symbols present at points/clock cycles 318.0-*n* and 319.0-*n* respectively. The value of coefficient W comprises the transfer function values of a FFE filter. The FFE filter is chosen (e.g. by an algorithm on the system level) in order to optimally shape the channel to a 1+0.5D pulse response. For example, given input parameter, actual values may be determined by eye optimization algorithm. The coefficient W further comprises or incorporates the shift value δ associated with the current symbol as defined above. The coefficient W further comprises the transfer function coefficient of an IIR filter convolved/convoluted with the FFE response applied to δ values. The transfer function of the IIR filter is $1/(1+0.5z^{-1})$. The IIR filter is shortened to the finite number of FFE taps. The role of the flip flops 350 is to make sure that a multiplier 311.0-*n* corresponds to two separate non-overlapping input values. For example, assume a stream of symbols x0 x1 x2 x3 x4 x5 x6 x7 then the input to the 16:1

MUXes with the present method would look like this: 311.0: x7 x6 311.1: x5 x4 311.2: x3 x2 311.3: x1 x0 (the multiplier 311.0 has as input x7 and x6 and so on) Without the additional flip-flops 350 it may look like 311.0: x7 x6 311.1: x6 x5 311.2: x5 x4 311.3: x4 x3 i.e. multipliers 311.0 and 311.1 would both see x6 etc. The summed signal output is input to a DAC 325.

The table 390 of FIG. 3B comprises 16 entries numbered by values 391, k=0-15 for each tap n. For example, 1×PAM-4 symbol comprises 2 bits, and 2×PAM-4 symbols is 2×2 bits. This implies 16 possibilities. 16:1 MUX cells selects 1 out of 16 table entries 394 based on 2 consecutive symbols 392 and 393 (e.g. the current recoded symbol Yn and the symbol Yn-1 immediately preceding the current symbol). For example, if for a given pair of symbols Yn and Yn-1 an entry is selected from the table 390, that entry incorporates the shift value associated with the current symbol Yn of the pair. Furthermore, that entry also reflects an IIR filter coefficient associated with the given shift value $\delta$.

For example, table 390 comprises for a given current symbol Yn representing value −3 and the symbol Yn-1 immediately preceding the current recoded symbol Yn represents also a value −3, the MUX cell 311 may select the value $-3*h_{2n}-3*h_{2n-1}+dw_{2n}+dw_{2n-1}$. The value $-3*h_{2n}-3*h_{2n-1}+dw_{2n}+dw_{2n-1}$ indicate that the value −3 of the current symbol Yn is multiplied by a FFE transfer function value (i.e. weight) $h_{2n}$ and the value −3 of the preceding symbol Xn-1 is multiplied by a FFE transfer function value $h_{2n-1}$. The weight $h_{2n}$ is determined and associated with respective tap 301.n in order to optimally shape the channel to a 1+0.5D pulse response. The value $-3*h_{2n}-3*h_{2n-1}+dw_{2n}+dw_{2n-1}$ further comprises the component $dw_{2n}+dw_{2n-1}$ which incorporates the convolution of the FFE transfer function with the truncated IIR transfer function at time indices 2n and 2n−1.

For example, $dw0_n=[zeros(NPRE+1) -½ ¼ -⅛ ⅟_{16} -⅟_{32} \ldots]$, where zeros (N) means a row vector of N zeros. This indicates that there are NPRE+1 leading zeros, followed by $-(-0.5)^n$ sequence, where n is an index e.g. starting at 0; 0.5 is from the IIR filter. This sequence corresponds to the inverse channel response of a 1+0.5D channel. NPRE refers to the number of pre-cursor taps in the FFE filter. The sum as calculated reflects the truncated IIR transfer function value. In addition, dw0n is convoluted with the FFE transfer function value, dw=conv(dw0,h), to obtain the coefficient to be applied. $dw_n=conv(dw0_n, h_n)$ evaluated at time index n. The 0 in dw0n stands for the unfiltered IIR response (i.e. before applying the FFE response hn). The operation such as the sum or the difference between $dw_{2n}$ and $dw_{2n-1}$ reflects the shift values $\delta$.

Figure 4:
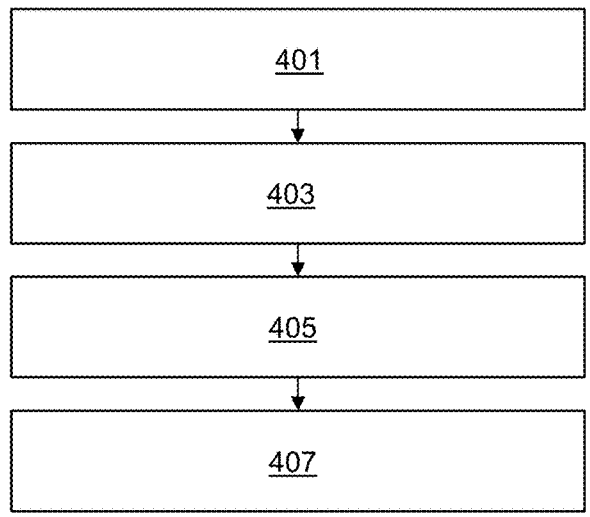
FIG. 4 is a flowchart of a method generating a sequence of output symbols to be transmitted in an output stream.
Figure 4:
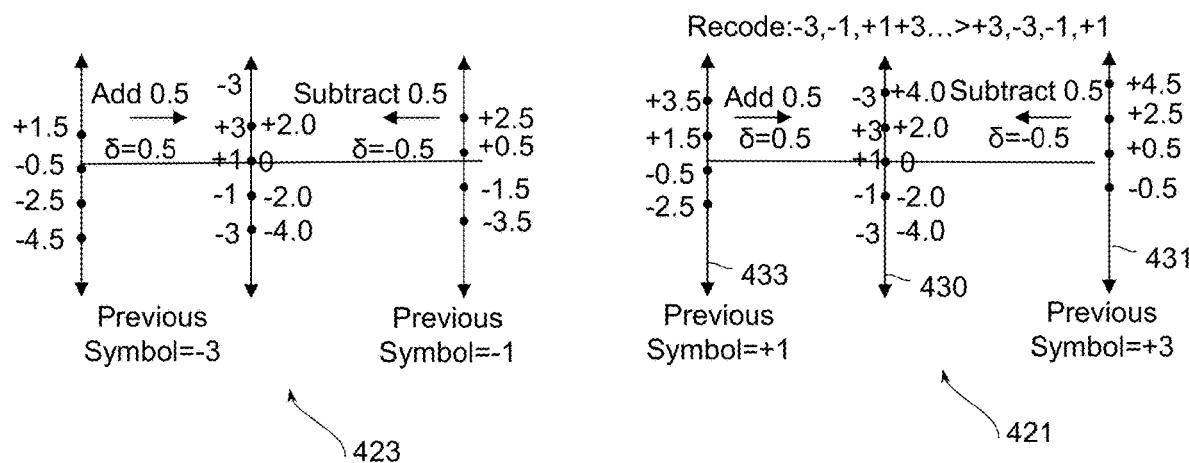

FIG. 4 is a flowchart of a method for generating a sequence of output symbols to be transmitted in an output stream using as input the PAM-4 symbols.

In step 401, a sequence of PAM-4 coded symbols X0, X1, . . . Xn is received as part of a stream at a recoding unit 265. For the very first symbol of the sequence e.g. X0, a predetermined initial arbitrary value may be used so as to recode X0 and to output Y0 which is the recoded symbol of X0, such that when step 403 is executed for the first time, Y0 exists.

For each current symbol Xn of the sequence of symbols X1-Xn, steps 403-407 may be executed.

In step 403, the current symbol Xn (e.g. n=1) may be recoded (e.g. using the recoding unit 265) based on the values of the recoded symbol Yn-1 (e.g. Y0) immediately preceding the current symbol Xn. If the previous recoded symbol Yn-1 is associated with a value −3 or −1, the current Xn is maintained as it is i.e. it is not recoded. If the previous recoded symbol Yn-1 is associated with a value +1 or +3, the recoding unit 265 changes the values of the current symbol Xn such that it represents another level. If the current symbol Xn reflects the level −3, −1, +1 or +3 it is recoded respectively to reflect the level +3, −3, −1 or +1. Step 403 results in a sequence of symbols Yn of the respective received symbols Xn, wherein a symbol Yn may or may not be a recoded symbol. E.g. the recoding the current symbol Xn is recursively performed based on immediately preceding recoded symbol Yn-1.

In step 405, the shift unit determines a shift value $\delta$ for each symbol Yn. For example, the shift unit may be configured to receive symbols Y1-Yn in sequence from the recoding unit. For determining the shift value $\delta$ for a current symbol Yn, the shift unit uses the symbol immediately preceding Yn which is Yn-1 i.e. Yn is received at the shift unit immediately after receiving at the shift unit Yn-1. If for example, the symbol Yn-1 is associated with a value −3 or +1, $\delta=+0.5$. And if Yn-1 is associated with a value −1 or +3 and $\delta=-0.5$. The determination of the shift value may be performed at the precoder such that the shift unit is part of the precoder or can be performed separately from the precoder e.g. at the transmit filter.

As indicated in the graphs of FIG. 4, the recoding and shifting enable the pre-code symbol values to have unique symbol assignment −4, −2, 0, 2, 4<-->−3, −1, +1, +3, −3. As also shown, in the graphs, the present method may enable that the input range of the receiver 104 is smaller than in DFE case: +/−4 instead +/−4.5 for 1+0.5D channel.

In step 407, for each symbol Yn output by the recoding unit, a FFE transfer function value may be determined and for the shift value $\delta$ of the each symbol Yn, a IIR transfer function value may be determined. This may for example be performed using 4 to 16 tap filters. The determined transfer function values as well as shift value $\delta$ of symbol Yn are applied to the each symbol Yn. This results in a sequence of output symbols to be transmitted in an output stream. As shown in graph 421, the previous symbol is +3 or +1 for a current symbol which is indicated to be associated with levels −1, +1, −3 or +3 on the most right 431 and most left axis 433 of graph 421 respectively. Without the present method, the symbol assignment (as illustrated in graphs 421 and 423) for the case where the previous symbol is +3, is indicated on axis 431 to be −1.5, +0.5, +2.5 and +4.5 for respective current symbol with levels −1, +1, +3 and −3 respectively. Also it is shown that without the present method the symbol assignment for the case where the previous symbol is +1, is indicated on axis 433 to be −2.5, −0.5, +1.5 and +3.5 for respective current symbol with levels −1, +1, +3 and −3 respectively. Thus, for a same current symbol the assignment at the receiver is different depending on the previous symbol. The present method prevents that by providing the same or unique assignment for the same current symbol regardless of its preceding symbol. This is shown on graph 421 where after applying the shift value, the assignment is the same for the same current symbol regardless of its preceding symbols. This is indicated in the medium axis 430 of graph 421, where unique symbol assignment −2, 0, 2, 4<-->−1, +1, +3, −3 is shown. The same is also described with graph 423 where the resulting −4, −2, 0, 2<-->−3, −1, +1, +3 is shown. The difference between graph 423 and 421 is that the current symbols of graph 421 (i.e. having +3 and +1 as preceding symbols) need to be recoded such that a current symbol representing or having level 3, −1, +1, +3 becomes 3, −3, −1, +1 respectively as illustrated in FIG. 4.

Figure 5:
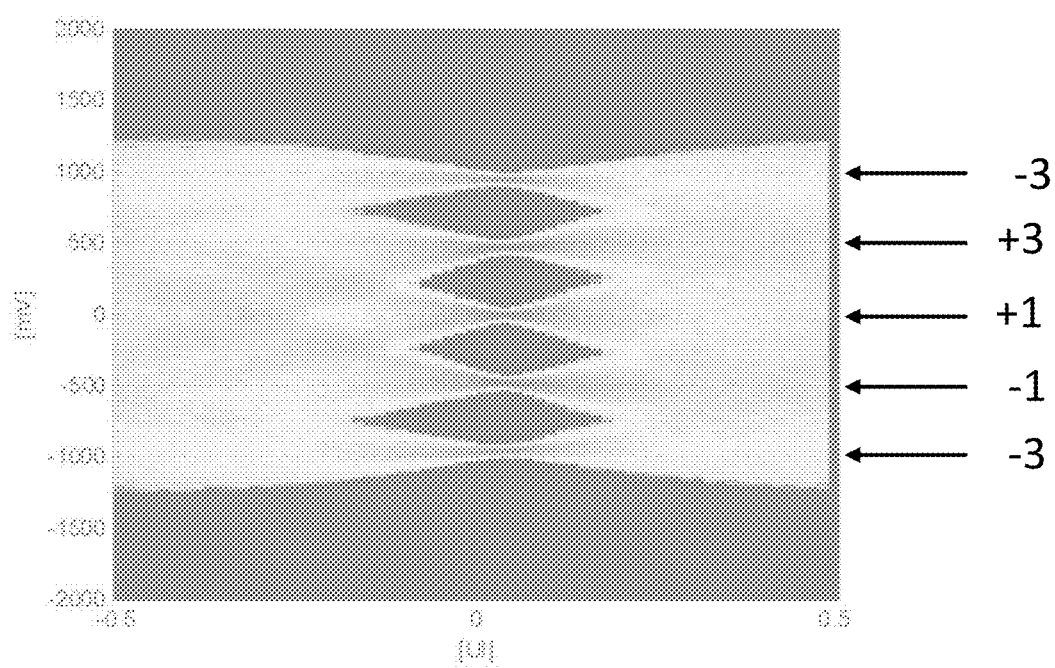
FIG. 5 shows a receiver eye diagram corresponding to a signal generated via the precoder of the present disclosure.

FIG. 5 shows a receiver eye diagram corresponding to a signal generated via the precoding and filtering section of the present disclosure. The diagram is the result of a simulation having the following properties.

Simulation with 8-tap table-based FFE filter (2-pre, 1 main, 5 post)

FFE is grouped into 4 segments, each segment has a table (390) for 2-FFE taps, 1 table=2 FFE taps=4 bits=16 entries. For example, the table entries can be reduced to 8 entries using symmetry around 0. For example, the power of 8-tap table based digital FFE in 14LPP is 0.3-0.5 pJ/bit @128 Gb/s.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product having a computer readable storage media storing instructions to generate a sequence of output symbols to be transmitted in an output stream, that when executed on a computing device, causes the computing device to execute a method, the method comprising:

receiving a sequence of pulse amplitude modulation (PAM) scheme having an order M, (PAM-M) symbols Xn;

recoding received PAM-M symbols, wherein recoding a current received symbol Xn is performed based on immediately preceding recoded symbol Yn−1; resulting in output recoded symbols Yn of the respective received symbols Xn;

for each output recoded symbol Yn;
  determining a shift value for the symbol Yn using a output recoded symbol Yn−1 immediately preceding the current symbol Yn;
  determining a feed-forward equalizer (FFE) transfer function value for the symbol Yn and infinite impulse response (IIR) transfer function value for the shift value of the symbol Yn and applying the determined FFE transfer function value, the IIR transfer function value and the shift value to the symbol Yn, for generating an output symbol.

2. The computer program product of claim 1, wherein the order M greater than two.

3. The computer program product of claim 2, the order M is an even number between 4 and 8.

4. The computer program product of claim 3, wherein in case the order M is 4 the shift value is equal to 0.5 or −0.5.

5. The computer program product of claim 1 wherein a transmit filter response for a given pair of symbol amplitude levels of a current symbol and its immediately preceding symbol comprises the shift value of the current symbol in combination with an IIR response filter and a FFE filter response for the bits of the current symbol.

6. The computer program product of claim 5 wherein the IIR filter has a filter feedback response G(z) given by the following equation $1/(1+0.5z^{-1})$.

7. The computer program product of claim 5 wherein the IIR filter comprises 4 to 6 tap filters.

* * * * *